United States Patent
Lim et al.

(10) Patent No.: US 7,361,548 B2
(45) Date of Patent: Apr. 22, 2008

(54) METHODS OF FORMING A CAPACITOR USING AN ATOMIC LAYER DEPOSITION PROCESS

(75) Inventors: Jae-Soon Lim, Seoul (KR); Sung-Tae Kim, Seoul (KR); Young-Sun Kim, Gyeonggi-do (KR); Young-Geun Park, Gyeonggi-do (KR); Suk-Jin Chung, Gyeonggi-do (KR); Seung-Hwan Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 323 days.

(21) Appl. No.: 11/065,086

(22) Filed: Feb. 24, 2005

(65) Prior Publication Data

US 2005/0208718 A1    Sep. 22, 2005

(30) Foreign Application Priority Data

Mar. 16, 2004    (KR) ...................... 10-2004-0017503

(51) Int. Cl.
*H01L 21/8242*    (2006.01)
(52) U.S. Cl. ...................... 438/253; 438/263; 438/369; 438/397; 438/E21.013; 257/296; 257/532
(58) Field of Classification Search ........ 438/253–256, 438/396–398; 257/296, 532
See application file for complete search history.

(56) References Cited

U.S. PATENT DOCUMENTS

| 5,352,494 | A | * | 10/1994 | Rousseau | 427/562 |
| 6,576,053 | B1 | * | 6/2003 | Kim et al. | 117/89 |
| 6,627,503 | B2 | | 9/2003 | Ma et al. | 438/287 |
| 2002/0106896 | A1 | * | 8/2002 | Kraus et al. | 438/688 |
| 2004/0187968 | A1 | * | 9/2004 | Vaartstra | 148/273 |

FOREIGN PATENT DOCUMENTS

| KR | 1020000008014 | 2/2000 |
| KR | 1020020065245 | 8/2002 |

* cited by examiner

*Primary Examiner*—Dung A. Le
(74) *Attorney, Agent, or Firm*—Myers Bigel Sibley & Sajovec

(57) ABSTRACT

Methods for forming a capacitor using an atomic layer deposition process include providing a reactant including an aluminum precursor onto a substrate to chemisorb a portion of the reactant to a surface of the substrate. The substrate has an underlying structure including a lower electrode. An ammonia ($NH_3$) plasma is provided onto the substrate to form a dielectric layer including aluminum nitride on the substrate including the lower electrode. An upper electrode is formed on the dielectric layer. A second dielectric layer may be provided oil the first dielectric layer.

22 Claims, 5 Drawing Sheets

METHODS OF FORMING A CAPACITOR USING AN ATOMIC LAYER DEPOSITION PROCESS

CROSS-REFERENCE TO RELATED APPLICATION

This application is related to and claims priority from Korean Patent Application No. 2004-17503, filed on Mar. 16, 2004, the disclosure of which is hereby incorporated herein by reference in its entirety.

BACKGROUND OF THE INVENTION

The present invention relates to integrated circuit devices and, more particularly, to methods of forming a capacitor using an atomic layer deposition (ALD) process.

A cell capacitance of a semiconductor memory device may be decreased when a size of a cell region of the semiconductor memory device is reduced to change the integration density of the semiconductor memory device. The reduction of the cell capacitance typically deteriorates readability of the semiconductor memory device and increases a soft error rate of the device. As a result, the semiconductor memory device may not properly operate at a low voltage due to the reduction of the cell capacitance.

To improve the cell capacitance of the semiconductor memory device having a small cell region, it is know to form a dielectric layer having a very thin thickness. It is also known to form a lower electrode having a cylindrical shape or a fin shape. In a dynamic random access memory (DRAM) device having a storage capacity of above about 1 gigabyte, however, the above-mentioned approaches generally may be not employed for manufacturing a DRAM device having a desired cell capacitance.

To address the above-mentioned problems, it is also known to form a dielectric layer of a capacitor using a material having a high dielectric constant instead of silicon nitride, such as tantalum oxide ($Ta_2O_5$) or aluminum oxide ($Al_2O_3$). For example, the dielectric layer of the capacitor may be formed using yttrium oxide ($Y_2O_3$), hafnium oxide ($HfO_2$), zirconium oxide ($ZrO_2$), niobium oxide ($Nb_2O_5$), barium titanate ($BaTiO_3$) or strontium titanate ($SrTiO_3$). These metal oxides may be used for a dielectric layer of a capacitor in a semiconductor memory device having a design rule of below about 1 μm.

When hafnium oxide is used for manufacturing a dielectric layer of a metal-insulator-metal (MIM) capacitor or hafnium oxide and aluminum oxide are employed for a composite dielectric layer of a capacitor, these dielectric layers may have reduced equivalent oxide thickness (EOT).

In addition, when a lower electrode of a capacitor is formed using polysilicon, a silicon nitride ($Si_3N_4$) film may be additionally formed on the lower electrode so as to protect the lower electrode from oxidizing. Here, the dielectric layer of the capacitor may include the silicon nitride film and a metal oxide film. Further, the dielectric layer may be formed using an atomic layer deposition (ALD) process. However, when the silicon nitride film is interposed between the lower electrode and the metal oxide film, the silicon nitride film may have a significant effect on the EOT of the dielectric layer because silicon nitride generally has a dielectric constant of about 7 to about 8.

SUMMARY OF THE INVENTION

Embodiments of the present invention include methods for forming a capacitor using an atomic layer deposition process. A reactant including an aluminum precursor is provided onto a substrate to chemisorb a portion of the reactant to a surface of the substrate. The substrate has an underlying structure including a lower electrode. An ammonia ($NH_3$) plasma is provided onto the substrate to form a dielectric layer including aluminum nitride on the substrate including the lower electrode and an upper electrode is formed on the dielectric layer.

In some embodiments of the present invention, a first purge gas is provided onto the substrate to remove an unreacted portion of the reactant before providing the ammonia ($NH_3$) plasma onto the substrate and a second purge gas is provided onto the substrate to remove by-products generated in forming the dielectric layer after providing the ammonia ($NH_3$) plasma onto the substrate. The aluminum precursor may be one or a combination of tri-methyl aluminum (TMA) and/or tri-ethyl aluminum (TEA). The upper electrode may be (or may be selected from a group consisting of) polysilicon, ruthenium (Ru), iridium (Ir), titanium nitride (TiN), tantalum nitride (TaN) and/or tungsten nitride (WN). The lower electrode may be (or may be selected from a group consisting of) polysilicon, ruthenium, iridium, titanium nitride, tantalum nitride and/or tungsten nitride.

In other embodiments of the present invention, the dielectric layer is formed at a temperature of below about 500° C. The methods may include repeatedly performing providing the reactant onto the substrate, providing the first purge gas onto the substrate, providing the ammonia plasma onto the substrate, and providing the second purge gas onto the substrate. The ammonia plasma may be provided onto the substrate by a remote plasma process and the ammonia plasma may be generated by a power of about 50 to about 500 Watts (W).

In further embodiments of the present invention, the dielectric layer is formed using a single wafer type chamber. The ammonia plasma in such embodiments may be provided onto the substrate for about 0.5 to about 10 seconds. In other embodiments the dielectric layer is formed using a batch type chamber and, in such embodiments, the ammonia plasma may be provided onto the substrate for about 10 to about 600 seconds.

In yet other embodiments of the present invention, methods for forming a capacitor using an atomic layer deposition process are provided. A reactant including an aluminum precursor is provided onto a substrate to chemisorb a portion of the reactant to a surface of the substrate. The substrate has an underlying structure including a lower electrode. An ammonia plasma is provided onto the substrate including the chemisorbed portion of the reactant to form a first dielectric layer including aluminum nitride on the substrate including the lower electrode. A second dielectric layer is formed on the first dielectric layer and an upper electrode is formed on the second dielectric layer.

In other embodiments, the methods further include providing a first purge gas onto the substrate to remove an unreacted portion of the reactant before providing the ammonia plasma onto the substrate and providing a second purge gas onto the substrate to remove by-products generated in forming the first dielectric layer before forming the second dielectric layer. The second dielectric layer may be formed by the atomic layer deposition process. The second dielectric layer may be (or may be selected from a group consisting of) hafnium oxide ($HfO_2$), aluminum oxide ($Al_2O_3$), titanium oxide ($TiO_2$), yttrium oxide ($Y_2O_3$), zirconium oxide ($ZrO_2$), tantalum oxide ($Ta_2O_5$), niobium oxide ($Nb_2O_5$), barium titanate ($BaTiO_3$), and/or strontium titanate ($SrTiO_3$).

In further embodiments of the present invention, the aluminum precursor is (or is selected from a group consisting of) tri-methyl aluminum and/or tri-ethyl aluminum. The first dielectric layer may be formed at a temperature of about 300 to about 400° C. Providing the reactant onto the substrate, providing the first purge gas onto the substrate, providing the ammonia plasma onto the substrate, and providing the second purge gas onto the substrate may be repeatedly performed. The ammonia plasma may be provided onto the substrate by a remote plasma process with a power of about 100 to about 450 Watts (W).

In yet other embodiments of the present invention, the dielectric layer is formed using a single wafer type chamber and the ammonia plasma is provided onto the substrate for about 0.5 to about 10 seconds. The dielectric layer may be formed using a batch type chamber and the ammonia plasma may be provided onto the substrate for about 10 to about 600 seconds.

BRIEF DESCRIPTION OF THE DRAWINGS

The present invention will now be described with reference exemplary embodiments illustrated in the attached drawings in which.

DETAILED DESCRIPTION OF THE INVENTION

Figure 1:
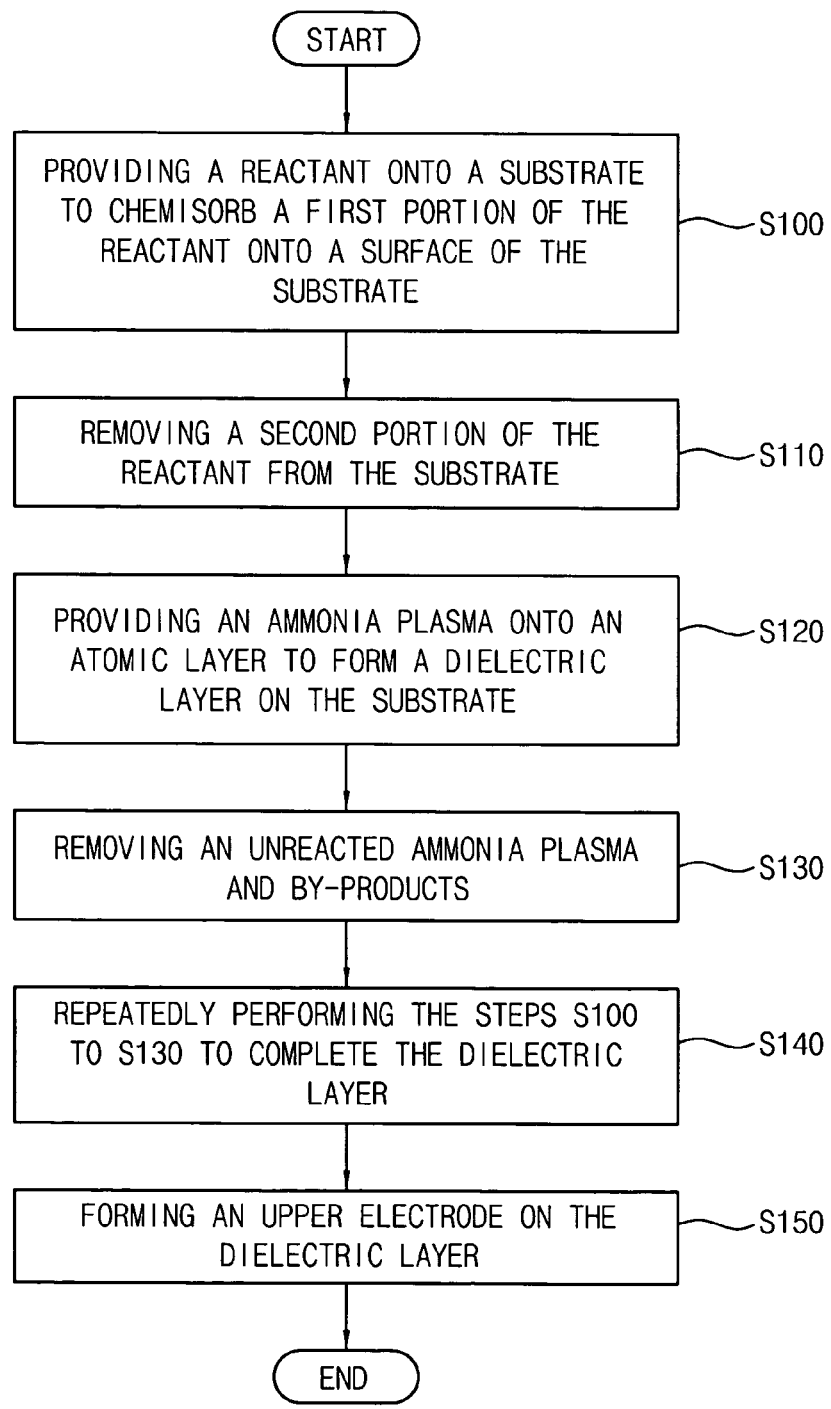
FIG. 1 is a flow chart illustrating methods for forming a capacitor in accordance with some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Various embodiments of the present invention will now be described with reference to FIG. 1. FIG. 1 is a flow chart illustrating methods for forming a capacitor in accordance with some embodiments of the present invention. As shown at block S100 of FIG. 1, a reactant including an aluminum precursor is provided onto a semiconductor (integrated circuit) substrate, such as a silicon wafer, so that a first portion of the reactant is chemisorbed to a surface of the semiconductor substrate. An underlying structure, including a lower electrode or a storage electrode, may be formed on the semiconductor substrate. Using a carrier gas, the reactant may be introduced into an atomic layer deposition chamber where the semiconductor substrate is loaded. The lower electrode may be formed through a chemical vapor deposition (CVD) process. Examples of a conductive material that may be used for the lower electrode include polysilicon, ruthenium (Ru), iridium (Ir), titanium nitride (TiN), tantalum nitride (TaN), tungsten nitride (WN) and/or the like. These materials can be used alone or in a combination thereof.

The aluminum precursor may include tri-methyl aluminum (TMA) and/or tri-ethyl aluminum (TEA). The carrier gas may include an inactive gas such as an argon (Ar) gas and/or a nitrogen ($N_2$) gas. The aluminum precursor in some embodiments includes TMA. The aluminum precursor may be introduced into the atomic layer deposition chamber using, for example, the carrier gas and a bubbler.

The atomic layer deposition chamber may be a single wafer type chamber in which an ALD process is carried out for a single wafer. Alternatively, the atomic layer deposition chamber may be a batch type chamber in which an ALD process is carried out concurrently for a plurality of the wafers. A mass flow controller (MFC) may control the flow rate of the reactant and a time of supplying the reactant into the atomic layer deposition chamber. The first portion of the aluminum precursor may be chemisorbed to the surface of the semiconductor substrate to form an atomic layer on the semiconductor substrate and a second portion of the aluminum precursor may be physically absorbed to a surface of the atomic layer.

At block S110, a first purge gas is provided onto the semiconductor substrate to remove the physically absorbed second portion of the reactant from the semiconductor substrate.

For the embodiments of FIG. 1, at block S120, an ammonia ($NH_3$) plasma is provided onto the atomic layer positioned on the semiconductor substrate to form a dielectric layer including aluminum nitride (AlN) on the semiconductor substrate. For example, the dielectric layer may be formed in accordance with a substitution reaction between the chemisorbed first portion of aluminum precursor and the ammonia plasma. The ammonia plasma may be introduced into the atomic layer deposition chamber by a remote plasma method. Alternatively, the ammonia plasma may be directly generated in the atomic layer deposition chamber.

A time during which the ammonia plasma is supplied to the atomic layer deposition chamber may vary based on a type of the atomic layer deposition chamber. When the single wafer type atomic layer deposition chamber is used for forming the dielectric layer, the time of supplying the ammonia plasma may be in a range of about 0.5 to about 10 seconds. When the batch type atomic layer deposition chamber is employed for forming the dielectric layer, the time of supplying the ammonia plasma may be in a range of about 10 to about 360 seconds.

In some embodiments, a power for generating the ammonia plasma may be in a range of about 50 to about 500 W. The power for generating the ammonia plasma may be in a range of about 100 to about 400 W.

The atomic layer deposition chamber may have a temperature of no more than about 500° C. during formation of the dielectric layer. In some embodiments, the atomic layer deposition chamber has a temperature of about 300 to about 400° C. during formation of the dielectric layer.

For the embodiments of FIG. 1, at block S130, a second purge gas is introduced into the atomic layer deposition chamber to remove an unreacted ammonia plasma and by-products generated in the formation of the dielectric layer. The second purge gas may include an inactive gas, such an argon gas and/or a nitrogen ($N_2$) gas. The second purge gas may include an inactive gas substantially identical to that of the first purge gas. In other embodiments, the second gas includes an inactive gas different from that of the first purge gas.

At block S140, operations of blocks S100 to S130 are repeated for a predetermined number of cycles to form a dielectric layer having a desired thickness on the semiconductor substrate. An upper electrode is formed on the dielectric layer positioned on the semiconductor substrate at block S150. The upper electrode may be formed, for example, using a CVD process. The upper electrode may include a conductive material. Examples of the conductive material for the upper electrode include doped polysilicon, ruthenium (Ru), iridium (Ir), titanium nitride (TiN), tantalum nitride (TaN), tungsten nitride (WN) and/or the like. These materials can be used alone or in a mixture thereof. The upper electrode may include a conductive material substantially identical to that of the lower electrode. In other embodiments, the upper electrode includes a conductive material different from that of the lower electrode.

As described above, a dielectric layer may be formed by a reaction between the aluminum precursor and the ammonia ($NH_3$) plasma. Thus, a dielectric layer including aluminum nitride (AlN) may be formed that has good performance characteristics and a capacitor including the dielectric layer may be formed that has improved electrical characteristics.

In some embodiments of the present invention, a metal oxide layer is formed on the dielectric layer including aluminum nitride. As such, a capacitor may be provided that has a multi-layered dielectric layer that includes a first dielectric layer of aluminum nitride and a second dielectric layer of metal oxide. Examples of a dielectric material for the second dielectric layer include hafnium oxide ($HfO_2$), aluminum oxide ($Al_2O_3$), titanium oxide ($TiO_2$), yttrium oxide ($Y_2O_3$), zirconium oxide ($ZrO_2$), tantalum oxide ($Ta_2O_5$), niobium oxide ($Nb_2O_5$), a barium titanate ($BaTiO_3$), a strontium titanate ($SrTiO_3$) and/or the like. These materials can be used alone or in a mixture thereof. The second dielectric layer including metal oxide in some embodiments is formed by an ALD process.

Figure 2A:
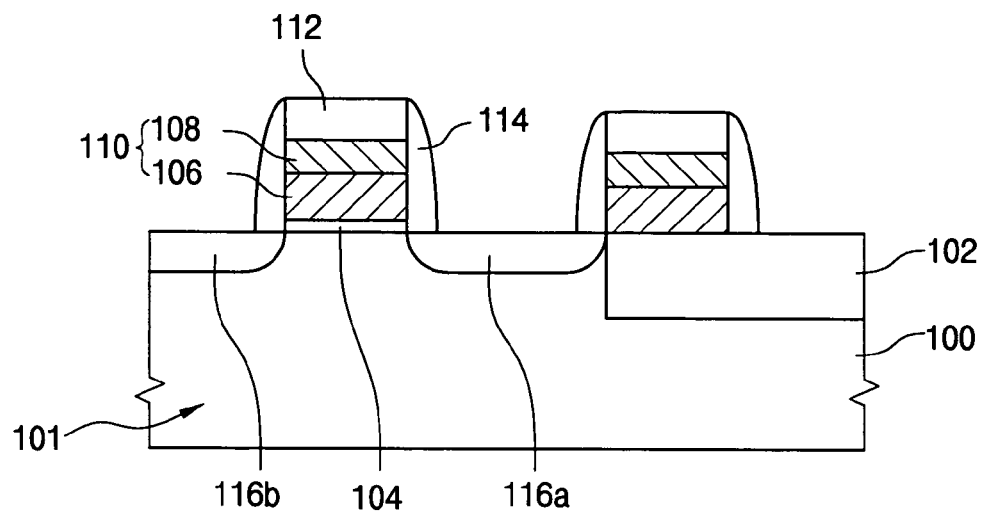
FIGS. 2A to 2E are cross sectional views illustrating methods for forming a capacitor in accordance with some embodiments of the present invention.

FIGS. 2A to 2E are cross sectional views illustrating methods for forming a capacitor according to some embodiments of the present invention. As shown in FIG. 2A, transistors are formed on a semiconductor substrate 100 having an active region 101 and a field region defined by an isolation layer 102. The illustrated transistor includes a gate insulation layer pattern 104, a gate electrode 110, source/drain regions 116a and 116b, a capping layer pattern 112, and a spacer 114.

The gate insulation layer pattern 104 may include silicon oxide ($SiO_2$), silicon oxynitride (SiON) and/or metal oxide. The gate insulation layer pattern 104 may be formed by a CVD process and/or an ALD process and may be formed to have a thickness of about 10 to about 70 Å. When the gate insulation layer pattern 104 includes metal oxide, the gate insulation layer pattern 104 may be formed using a metal precursor and an activated oxidant using an ALD process. Examples of the activated oxidant include ozone ($O_3$), oxygen ($O_2$) plasma, remote oxygen ($O_2$) plasma, nitrous oxide ($N_2O$) plasma and/or the like. In particular embodiments, the gate insulation layer pattern 104 is formed using hafnium tetra-t-butoxide ($Hf(OtBu)_4$) and ozone by the ALD process.

The gate electrode 110 may have a polycide structure having a polysilicon layer pattern 106 doped with impurities and a metal silicide layer pattern 108 formed on the polysilicon layer pattern 106. The polysilicon layer pattern 106 is illustrated formed on the gate insulation layer pattern 104 and the metal silicide layer pattern 108 is positioned on the polysilicon layer pattern 106.

The capping layer pattern 112 in the embodiments of FIG. 2A is formed on the gate electrode 110 and the spacers 114 are formed on sidewalls of the gate electrode 110 and the capping layer pattern 112. The capping layer pattern 112 may include an insulation material, such as silicon nitride and/or silicon oxide. The spacer 114 may be formed using an insulation material, such as silicon nitride and/or silicon oxide.

Figure 2B:
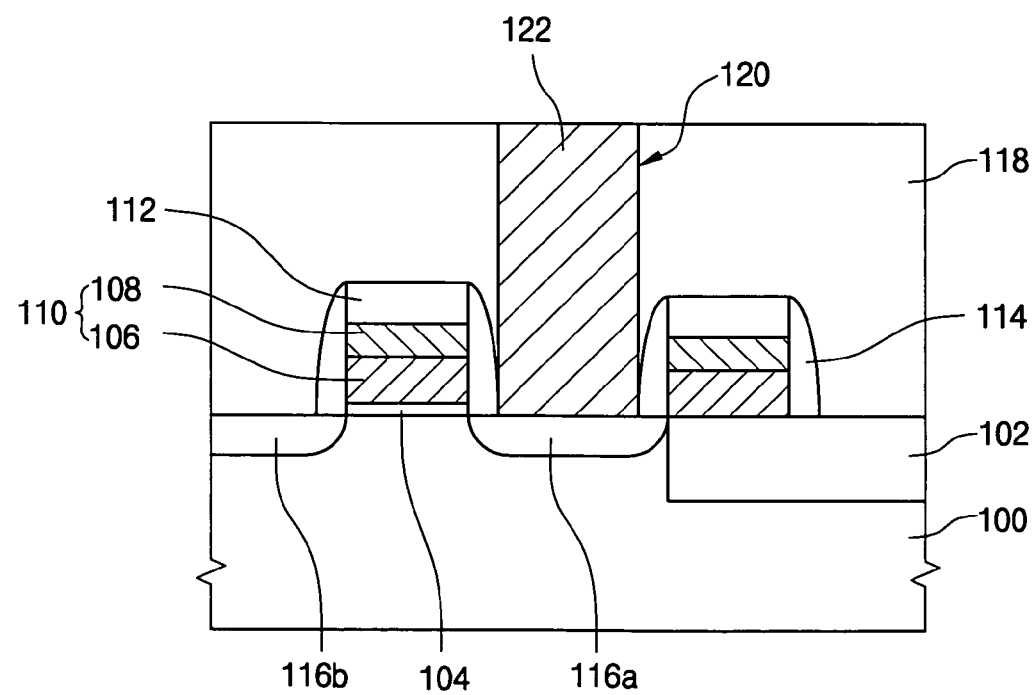

As shown in the embodiments of FIG. 2B, a first insulation layer 118 is formed on the semiconductor substrate 100 to cover the transistors. The first insulation layer 118 may include an oxide. The first insulation layer 118 is partially etched via a photolithography process to form a contact hole 120 that exposes a portion of the source/drain regions 116a and 116b.

A first conductive layer (not shown) filling up the contact hole 120 is formed on an exposed portion of the source/drain regions 116a and 116b and on the first insulation layer 118. The first conductive layer may be formed, for example, using polysilicon doped with prosperous (P). The first conductive layer is etched by an etch back process and/or a chemical mechanical polishing (CMP) process until the first insulation layer 118 is exposed, thereby forming a contact plug 122 in the contact hole 120. The contact plug 122 makes electrical contact with the source/drain regions 116a and/or 116b.

Figure 2C:
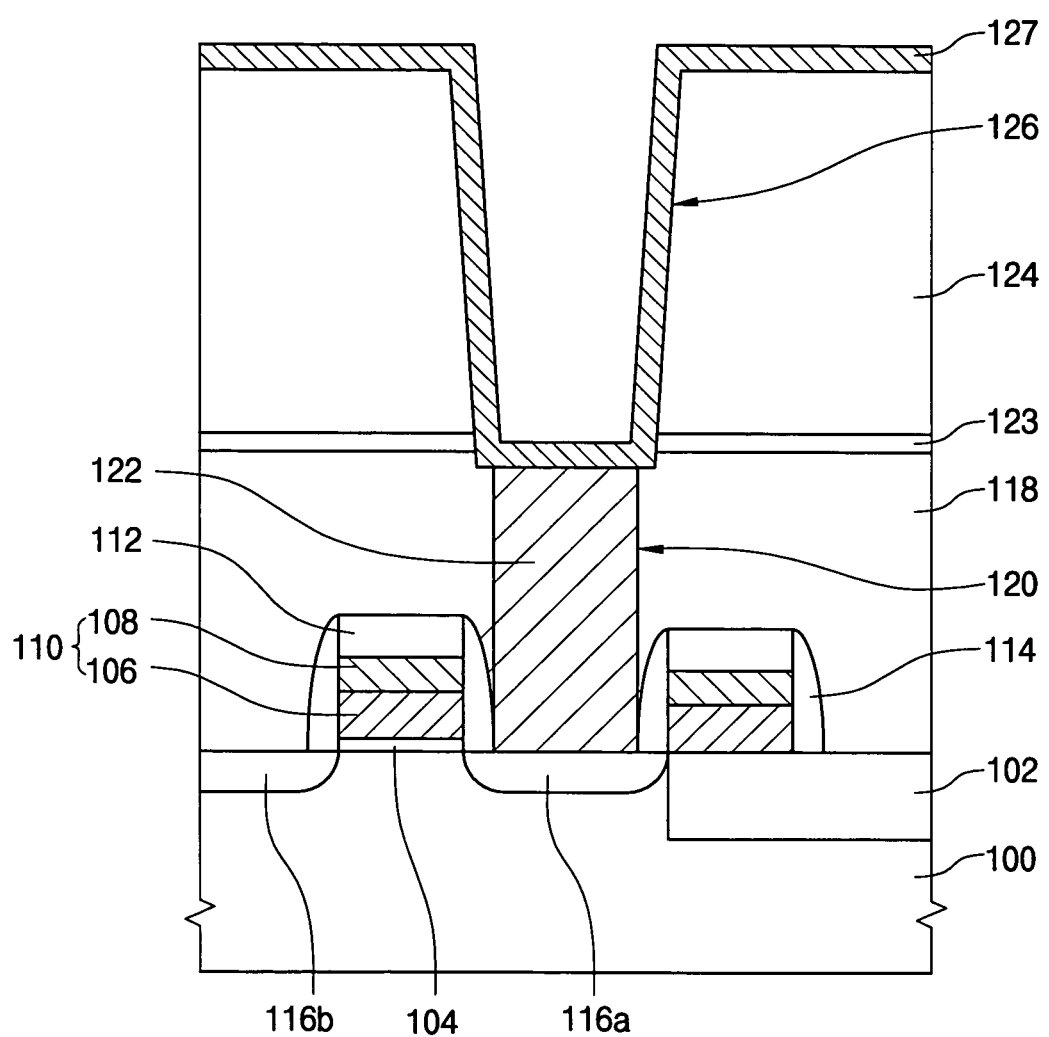

As shown in FIG. 2C, an etch stop layer 123 is formed on the contact plug 122 and the first insulation layer 118. The etch stop layer 123 may be formed using a material having a different etching rate with respect to the first insulation layer 118 for a specific condition. For example, the etch stop layer 123 may be formed using silicon nitride and/or silicon oxynitride.

After a second insulation layer 124 is formed on the etch stop layer 123, the second insulation layer 124 is partially etched to form an opening 126 that exposes the contact plug 122. The second insulation layer 124 may be formed, for example, using an oxide. In some embodiments of the present invention, the second insulation layer 124 is etched until a portion of the etching stop layer 123 is exposed and then the second insulation layer 124 is over etched for a predetermined time to form the opening 126 that exposes the contact plug 122 and a portion of the first insulation layer 118 around the contact plug 122.

As shown in FIG. 2C, a second conductive layer 127 is formed on the contact plug 122, an inside of the opening 126 and on the second insulation layer 124. The second conductive layer 127 may include a semiconductor material, a rare metal and/or a metal nitride. Examples of the semiconductor material include doped polysilicon, and examples of the rare metal include ruthenium, platinum (Pt), iridium and/or the like. Examples of the metal nitride include titanium nitride (TiN), tantalum nitride (TaN), tungsten nitride (WN) and/or the like.

Figure 2D:
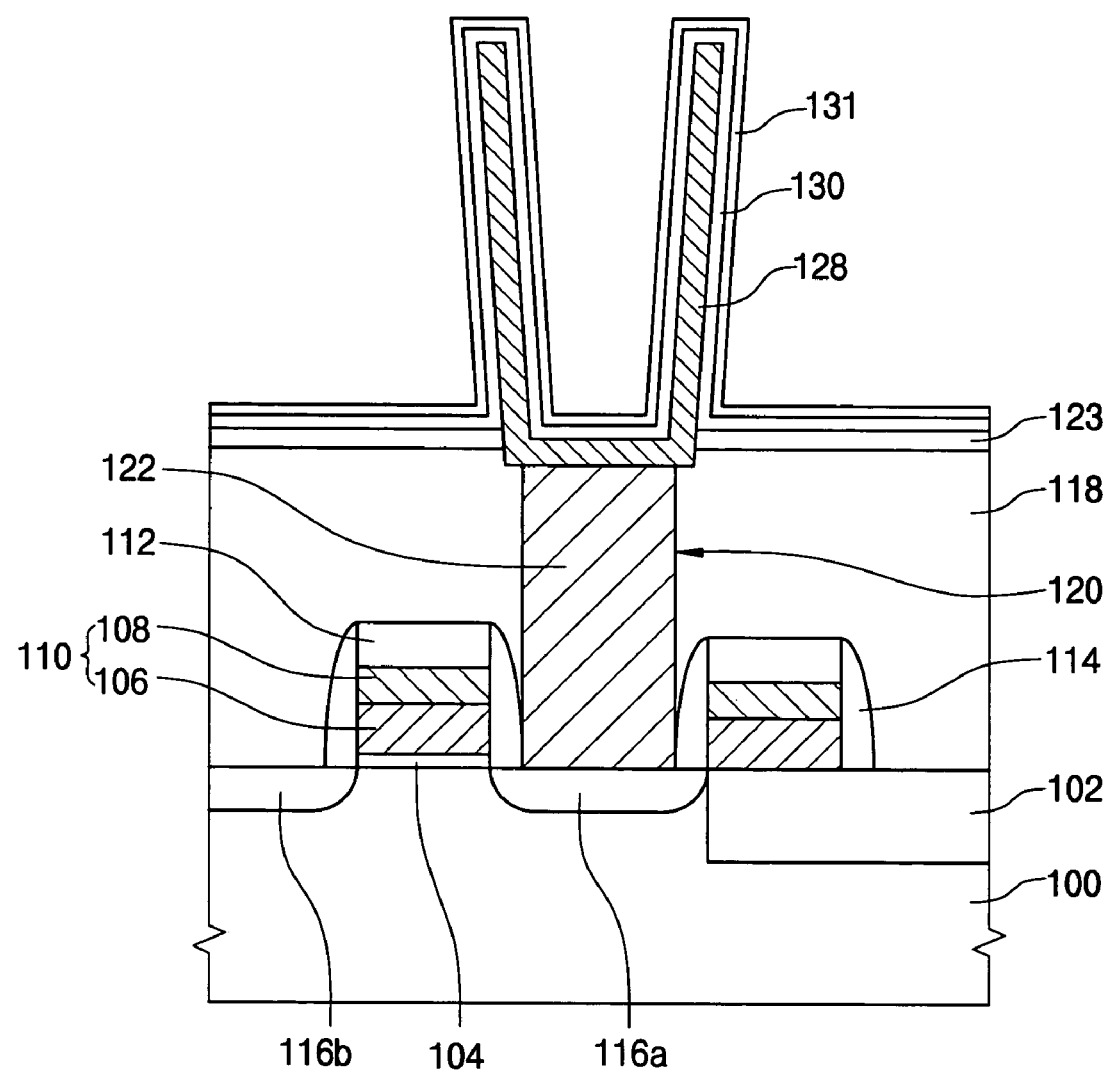

Referring now to the embodiments of FIG. 2D, after a sacrificial layer (not shown) is formed on the second conductive layer 127, upper portions of the second conductive layer 127 and the sacrificial layer are removed by an etch back process and/or a CMP process until the second insulation layer 124 is exposed. The sacrificial layer and the second insulation layer 124 are removed by, for example, a wet etching process to form a lower electrode 128 on the contact plug 122.

A first dielectric layer 130 is shown in FIG. 2D formed on the lower electrode 128. The first dielectric layer 130 may be formed using, for example, aluminum nitride (AlN) by an ALD process. In some embodiments, the first dielectric layer 130 is formed using a reactant including an aluminum precursor and an ammonia ($NH_3$) plasma.

A second dielectric layer 131 is shown in the embodiments of FIG. 2D formed on the first dielectric layer 130. The second dielectric layer 131 may be formed using hafnium oxide ($HfO_2$) by an ALD process. In some embodiments, the second dielectric layer 131 is formed using a hafnium alkoxide precursor and an activated oxidant. Examples of the hafnium alkoxide precursor include hafnium tetra-t-butoxide ($Hf(OtBu)_4$), and examples of the activated oxidant include ozone ($O_3$), oxygen ($O_2$) plasma, remote oxygen plasma, nitrous oxide ($N_2O$) plasma and/or the like.

Figure 2E:
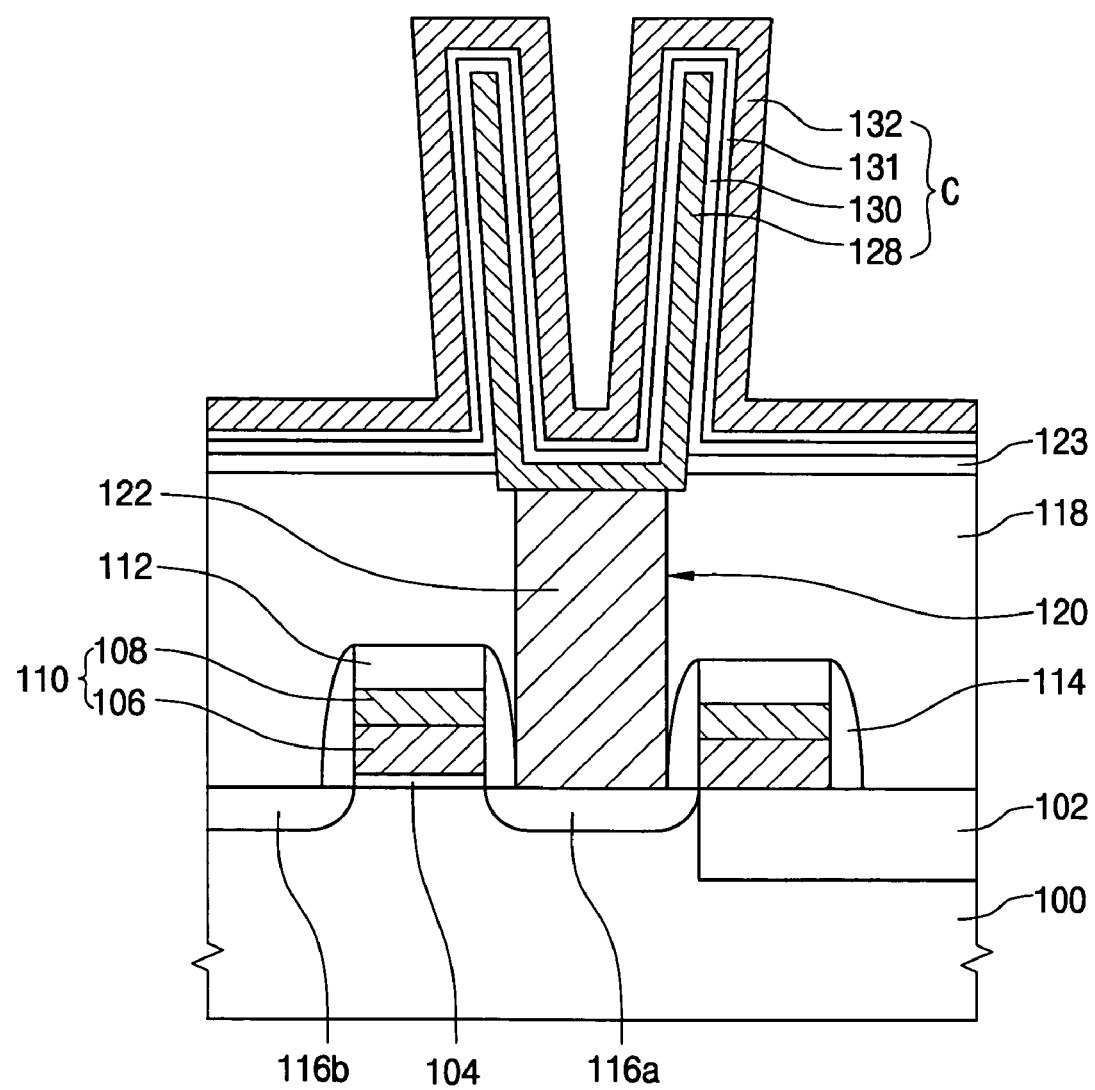

As seen in the embodiments of FIG. 2E, an upper electrode 132 is formed on the second dielectric layer 131 to complete a capacitor C including the lower electrode 128, the first dielectric layer 130, the second dielectric layer 131, and the upper electrode 132. The upper electrode 132 may be formed using, for example, a semiconductor material, a rare metal, and/or a metal nitride. Examples of the semiconductor material include doped polysilicon. Examples of the rare metal include ruthenium, platinum, iridium and/or the like. Examples of the metal nitride include titanium nitride, tantalum nitride, tungsten nitride and/or the like. The upper electrode 132 may have a multi-layered structure that includes a titanium nitride layer and a tantalum nitride layer sequentially stacked on the second dielectric layer 131. The titanium nitride layer may be formed at a temperature of no more than about 550° C. so as to limit or prevent thermal deterioration of underlying structures.

In some embodiments of the present invention, a conductive layer is formed on the upper electrode 132. For example, after forming the upper electrode 132 including titanium nitride, the additional conductive layer may be deposited in connection with successive processes for manufacturing a semiconductor memory device. Examples of the additional conductive layer material include N-type or P-type doped polysilicon, N-type or P-type doped silicon germanium (SiGe), a metal, a metal nitride and/or the like. Examples of the metal include tungsten (W). Examples of the metal nitride include tungsten nitride (WN), aluminum nitride (AlN) and/or the like.

The capacitor C may have a multi-layered dielectric layer including the first dielectric layer 130 and the second dielectric layer 131. In other embodiments, the capacitor C has a single-layered dielectric layer including only the first dielectric layer 130.

Table 1 shows experimental results from inspecting aluminum nitride layers formed under different processing conditions. The experimental results in Table 1 are obtained by an X-ray photo-electronic spectroscopy (XPS) method.

TABLE 1

|  | incident angle of X-ray | O | N | C | Si | Al |
|---|---|---|---|---|---|---|
| TMA + NH$_3$ | 90° | 53.0% | 0.5% | 7.2% | — | 39.3% |
| TMA + N$_2$ plasma | 30° | 43.5% | 8.0% | 18.9% | 6.5% | 23.0% |
|  | 90° | 44.9% | 7.8% | 13.9% | 16.0% | 17.4% |
| TMA + NH$_3$ plasma | 30° | 42.8% | 11.3% | 11.3% | 2.4% | 32.2% |
|  | 90° | 34.3% | 18.9% | 6.9% | 6.7% | 33.2% |

As shown in Table 1, a content of nitrogen in a first process aluminum nitride layer formed by an ALD process using a TMA source and an ammonia (NH$_3$) gas (TMA+NH$_3$) may be below about 1%. Thus, the first process aluminum nitride may layer have poor characteristics. Content of carbon and oxygen in a second process aluminum nitride layer formed by an ALD process using a TMA source and a nitrogen plasma (TMA+N$_2$ plasma) are shown as higher than those of a third process aluminum nitride layer formed by an ALD process using a TMA source and an ammonia plasma (TMA+NH$_3$ plasma). On the other hand, contents of aluminum and nitrogen in the second process aluminum nitride layer are lower than those of the third process aluminum nitride layer. Accordingly, the second process aluminum nitride layer includes more impurities than the third process aluminum nitride layer. As a result, dielectric characteristics of the third process aluminum nitride layer may be substantially superior to those of the second process aluminum nitride layer.

According to some embodiments of the present invention, a capacitor includes a first dielectric layer and a second dielectric layer. The first dielectric layer is formed by an atomic layer deposition process that employs an aluminum precursor and an ammonia plasma, and the second dielectric layer is formed using a material having a high dielectric constant. Thus, the capacitor including the first and second dielectric layers may have an equivalent oxide thickness (EOT) substantially lower than that of a conventional capacitor having a dielectric layer of silicon nitride. Additionally, the capacitor may have improved electrical characteristics due to a multi-layered dielectric layer including the first and second dielectric layers.

The flowchart of FIG. 1 illustrates the functionality and operation of possible implementations of methods for forming a capacitor according to various embodiments of the present invention. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method for forming a capacitor using an atomic layer deposition process, the method comprising:
    providing a reactant including an aluminum precursor onto a substrate to chemisorb a portion of the reactant to a surface of the substrate, the substrate having an underlying structure including a lower electrode;
    providing an ammonia (NH$_3$) plasma onto the substrate to form a dielectric layer including aluminum nitride on the substrate including the lower electrode; and
    forming an upper electrode on the dielectric layer.

2. The method of claim 1, further comprising:
    providing a first purge gas onto the substrate to remove an unreacted portion of the reactant before providing the ammonia (NH$_3$) plasma onto the substrate; and
    providing a second purge gas onto the substrate to remove by-products generated in forming the dielectric layer after providing the ammonia (NH$_3$) plasma onto the substrate.

3. The method of claim 1, wherein the aluminum precursor comprises tri-methyl aluminum (TMA) and/or tri-ethyl aluminum (TEA).

4. The method of claim 1, wherein the upper electrode comprises polysilicon, ruthenium (Ru), iridium (Ir), titanium nitride (TiN), tantalum nitride (TaN) and/or tungsten nitride (WN), and wherein the lower electrode comprises polysilicon, ruthenium, iridium, titanium nitride, tantalum nitride and/or tungsten nitride.

5. The method of claim 1, wherein the dielectric layer is formed at a temperature of below about 500° C.

6. The method of claim 2, further comprising repeatedly performing providing the reactant onto the substrate, providing the first purge gas onto the substrate, providing the ammonia plasma onto the substrate, and providing the second purge gas onto the substrate.

7. The method of claim 1, wherein the ammonia plasma is provided onto the substrate by a remote plasma process.

8. The method of claim 1, wherein the ammonia plasma is generated by a power of about 50 to about 500 Watts (W).

9. The method of claim 1, wherein the dielectric layer is formed using a single wafer type chamber.

10. The method of claim 9, wherein the ammonia plasma is provided onto the substrate for about 0.5 to about 10 seconds.

11. The method of claim 2, wherein the dielectric layer is formed using a batch type chamber.

12. The method of claim 11, wherein the ammonia plasma is provided onto the substrate for about 10 to about 600 seconds.

13. A method for forming a capacitor using an atomic layer deposition process, the method comprising:
providing a reactant including an aluminum precursor onto a substrate to chemisorb a portion of the reactant to a surface of the substrate, the substrate having an underlying structure including a lower electrode;
providing an ammonia plasma onto the substrate including the chemisorbed portion of the reactant to form a first dielectric layer including aluminum nitride on the substrate including the lower electrode;
forming a second dielectric layer on the first dielectric layer, the second dielectric layer comprising a different material from the dielectric layer; and
forming an upper electrode on the second dielectric layer.

14. The method of claim 13, further comprising:
providing a first purge gas onto the substrate to remove an unreacted portion of the reactant before providing the ammonia plasma onto the substrate; and
providing a second purge gas onto the substrate to remove by-products generated in forming the first dielectric layer before forming the second dielectric layer.

15. The method of claim 13, wherein the second dielectric layer comprises an oxide layer that is formed by the atomic layer deposition process.

16. The method of claim 13, wherein the second dielectric layer comprises hafnium oxide ($HfO_2$), aluminum oxide ($Al_2O_3$), titanium oxide ($TiO_2$), yttrium oxide ($Y_2O_3$), zirconium oxide ($ZrO_2$), tantalum oxide ($Ta_2O_5$), niobium oxide ($Nb_2O_5$), barium titanate ($BaTiO_3$), and/or strontium titanate ($SrTiO_3$).

17. The method of claim 13, wherein the aluminum precursor comprises tri-methyl aluminum and/or tri-ethyl aluminum.

18. The method of claim 13, wherein the first dielectric layer is formed at a temperature of about 300 to about 400° C.

19. The method of claim 14, further comprising repeatedly performing providing the reactant onto the substrate, providing the first purge gas onto the substrate, providing the ammonia plasma onto the substrate, and providing the second purge gas onto the substrate.

20. The method of claim 13, wherein the ammonia plasma is provided onto the substrate by a remote plasma process with a power of about 100 to about 450 Watts (W).

21. The method of claim 13, wherein the dielectric layer is formed using a single wafer type chamber and wherein the ammonia plasma is provided onto the substrate for about 0.5 to about 10 seconds.

22. The method of claim 14, wherein the dielectric layer is formed using a batch type chamber and wherein the ammonia plasma is provided onto the substrate for about 10 to about 600 seconds.

* * * * *

UNITED STATES PATENT AND TRADEMARK OFFICE
CERTIFICATE OF CORRECTION

PATENT NO. : 7,361,548 B2  Page 1 of 1
APPLICATION NO. : 11/065086
DATED : April 22, 2008
INVENTOR(S) : Lim et al.

It is certified that error appears in the above-identified patent and that said Letters Patent is hereby corrected as shown below:

On Title Page:
Item 57 Abstract: Line 10, Please correct "oil" to read -- on --

Column 11, Claim 13, Line 16: Please correct "from the dielectric"
To read -- from the first dielectric --

Signed and Sealed this

Eighth Day of July, 2008

JON W. DUDAS
*Director of the United States Patent and Trademark Office*